United States Patent [19]
Pfiester et al.

[11] Patent Number: 5,405,806
[45] Date of Patent: Apr. 11, 1995

[54] METHOD FOR FORMING A METAL SILICIDE INTERCONNECT IN AN INTEGRATED CIRCUIT

[75] Inventors: James R. Pfiester; James D. Hayden; Michael P. Woo, all of Austin, Tex.

[73] Assignee: Motorola Inc., Schaumburg, Ill.

[21] Appl. No.: 219,328

[22] Filed: Mar. 29, 1994

[51] Int. Cl.$^6$ ............... H01L 21/283; H01L 21/336
[52] U.S. Cl. .................... 437/200; 437/41; 437/195; 437/203; 437/228; 448/DIG. 19; 448/DIG. 147
[58] Field of Search ............ 437/200, 195, 41, 44, 437/203, 228; 148/DIG. 19, DIG. 147

[56] References Cited

U.S. PATENT DOCUMENTS

| | | | |
|---|---|---|---|
| 4,476,482 | 10/1984 | Scott et al. | 357/71 |
| 4,551,908 | 11/1985 | Nagasawa et al. | 437/203 |
| 4,581,623 | 4/1986 | Wang | 437/200 |
| 4,810,668 | 3/1989 | Ito | 437/67 |
| 4,936,950 | 6/1990 | Doan et al. | 156/643 |
| 4,981,550 | 1/1991 | Huttermann et al. | 156/643 |
| 5,034,348 | 7/1991 | Hartswick et al. | 437/200 |

OTHER PUBLICATIONS

Krakauer et al., "ESD Protection in a 3.3V Sub-Micron Silicided CMOS Technology," Electrical Overstress-/Electrostatic Discharge Symposium Proceedings, Sep. 16, 1992, pp. 250–257.

Charvaka Duvvury, "ESD Reliability for Advanced CMOS Technologies," 1990 International Electron Devices and Materials Symposium, Nov. 14, 1990, pp. 265–272.

Iyer et al., "New Salicide Spacer Technology," IBM Technical Disclosure Bulletin, vol. 27, No. 3, Aug. 1984, pp. 1801–1802.

Pfiester et al., "An Integrated 0.5um CMOS Disposable TiN LDD/Salicide Spacer Technology," Proceedings of the International Electron Devices Meeting, Dec. 1989, pp. 781–784.

*Primary Examiner*—T. N. Quach
*Attorney, Agent, or Firm*—Kent J. Cooper

[57] ABSTRACT

A metal silicide interconnect (48, 92, 124) is formed in an integrated circuit using a sacrificial layer (30, 78, 108). In one embodiment a sacrificial layer of titanium nitride (30) is formed overlying a semiconductor substrate (12) and a polysilicon conductive member (20). The sacrificial titanium nitride layer (30) is then patterned and an underlying portion (40) of the semiconductor substrate (12), and a sidewall portion (42) of the polysilicon conductive member (20) are subsequently exposed. A metal layer (46) is deposited and then reacted with the exposed portion 40 of the semiconductor substrate (12) and the exposed sidewall (42) of the polysilicon conductive member (20) to form a metal silicide interconnect (48). The remaining portion of the sacrificial titanium nitride layer (38) is then removed after the metal silicide interconnect (48) has been formed without substantially altering the metal silicide interconnect (48).

19 Claims, 6 Drawing Sheets

METHOD FOR FORMING A METAL SILICIDE INTERCONNECT IN AN INTEGRATED CIRCUIT

FIELD OF THE INVENTION

The present invention relates to integrated circuits in general, and more specifically to a method for forming a metal silicide interconnect in an integrated circuit.

BACKGROUND OF THE INVENTION

In advanced integrated circuits, multiple levels of interconnect are required to electrically couple various devices together, and to route electrical signals from one area of the integrated circuit to another. In addition, as the device density of an integrated circuit increases, more levels of interconnect are generally required to fabricate it. The parasitic resistance associated with these various levels of interconnect, however, must be minimized because high interconnect resistance degrades the performance and the reliability of an integrated circuit.

In the past, doped regions of silicon and polysilicon have been used as interconnects in integrated circuits. These doped regions, however, have a high resistance, and therefore the performance and the reliability of advanced integrated circuits fabricated with these interconnects is degraded. Accordingly, a need exists for a method for forming low resistance interconnects in advanced integrated circuits.

SUMMARY OF THE INVENTION

The previously mentioned problem with existing interconnects are overcome by the present invention. In one embodiment of the invention, a metal silicide interconnect in an integrated circuit is formed by providing a silicon material. A dielectric layer is then formed overlying the silicon material. A sacrificial layer of material is formed overlying the dielectric layer and a photoresist mask is then formed overlying the sacrificial layer of material, wherein the photoresist mask defines an exposed portion of the sacrificial layer of material. The exposed portion of the sacrificial layer of material is then etched to leave a remaining portion of the sacrificial layer of material overlying the silicon material, and to form an exposed portion of the dielectric layer. The exposed portion of the dielectric layer is then etched to form an exposed portion of the silicon material. After the photoresist mask is removed, a metal layer is deposited overlying the exposed portion of the silicon material and the remaining portion of the sacrificial layer of material. The metal layer is then reacted with the exposed portion of the silicon material to form a metal silicide interconnect. The remaining portion of the sacrificial layer of material is then removed after the metal silicide interconnect has been formed without substantially altering the metal silicide interconnect. These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
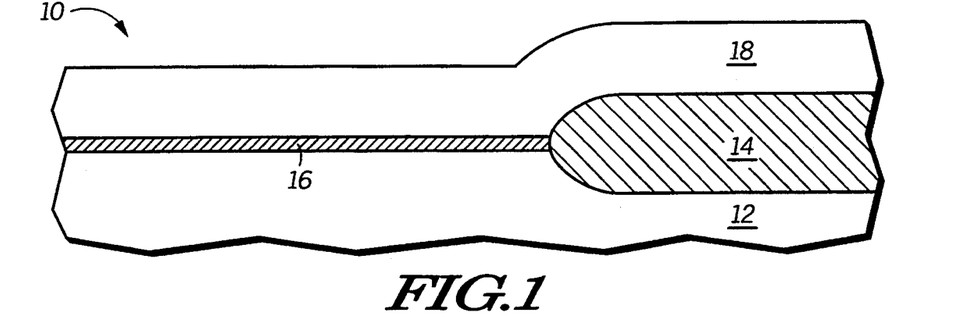
FIGS. 1–8 illustrate, in cross-section, process steps in accordance with one embodiment of the invention.

FIGS. 1 through 8 illustrate, in cross-section, process steps in accordance with one embodiment of the invention, wherein a metal silicide interconnect is formed in an integrated circuit. Shown in FIG. 1 is a portion 10 of an integrated circuit structure comprising a semiconductor substrate 12 of silicon material, a field isolation region 14, a gate dielectric layer 16, and a conductive layer 18. Semiconductor substrate 12 is preferably a monocrystalline silicon substrate. Alternatively, semiconductor substrate 12 may also be a silicon on insulator substrate, a silicon on sapphire substrate, or the like. Field isolation region 14 is preferably a layer of thermal silicon dioxide, which is formed using well know isolation techniques such as local oxidation of silicon (LOCOS), polysilicon buffered LOCOS (PBL), or the like, and has a thickness ranging from 100 to 1000 nanometers. Alternatively, field isolation region 14 may also be formed using other isolation techniques, such as shallow trench isolation (STI). In addition, although it is not shown in FIG. 1 a doped channel stop region may also be formed to underlie field isolation region 14 using well-known techniques. For example, a doped channel stop region may be formed by implanting a portion of semiconductor substrate 12 and then thermally oxidizing that portion of semiconductor substrate 12 to form field isolation region 14. After field isolation region 14 has been formed, gate dielectric layer 16 is formed and preferably has a thickness ranging from 3 to 20 nanometers. In one embodiment gate dielectric layer 16 is formed by thermally oxidizing a surface portion of semiconductor substrate 12. Alternatively, gate dielectric layer 16 may be a layer of chemically vapor deposited silicon dioxide, or another dielectric material such as silicon oxynitride, which may be formed by thermally nitriding a layer of thermal or deposited silicon dioxide in an ambient containing ammonia ($NH_3$), nitrous oxide ($N_2O$), or nitric oxide (NO). Moreover, gate dielectric layer 16 may be a laminate comprising a layer of chemically vapor deposited silicon dioxide overlying either a layer of thermal silicon dioxide or a layer of silicon oxynitride. Conductive layer 18 is then formed overlying gate dielectric layer 16 and field isolation region 14. Conductive layer 18 is preferably a doped polysilicon layer, which is formed using conventional deposition and doping techniques, and may have either an n-type or a p-type conductivity. Alternatively, conductive layer 18 may be a laminate comprising a doped polysilicon layer underlying either a metal silicide layer, a metal layer, or a metal nitride layer.

Figure 2:
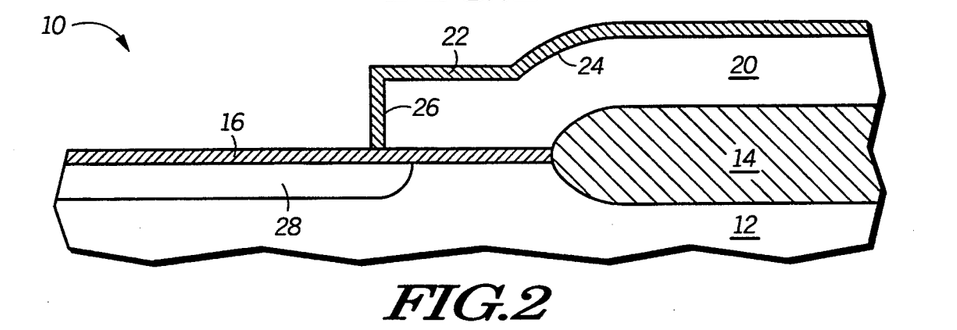

In FIG. 2, conductive layer 18 is patterned using conventional photolithographic patterning and etching techniques to form a conductive member 20. In one embodiment, conductive member 20 serves as the gate electrode for a first transistor, which is not shown. After being patterned, a portion of conductive member 20 is then thermally oxidized to form a silicon dioxide layer 22 that abuts the top surface 24 and the sidewall 26 of conductive member 20. It should also be appreciated that if conductive layer 18 is a laminate, as previously discussed, then silicon dioxide layer 22 may also be formed such that it does not overlie top surface 24, and it only abuts a portion of sidewall 26. After silicon dioxide layer 22 has been formed, a portion of semiconductor substrate 12 is then implanted with ions having either an n-type or p-type conductivity to form a doped region 28 within a portion of semiconductor substrate 12. In one embodiment, doped region 28 is a source or drain electrode for a second transistor, which is not shown. It should also be appreciated that conductive member 20 may also be doped at the same time that doped region 28 is formed. In addition, it is important to note that conductive member 20 and doped region 28 may be formed having either the same conductivity type or having different conductivity types.

Figure 3:
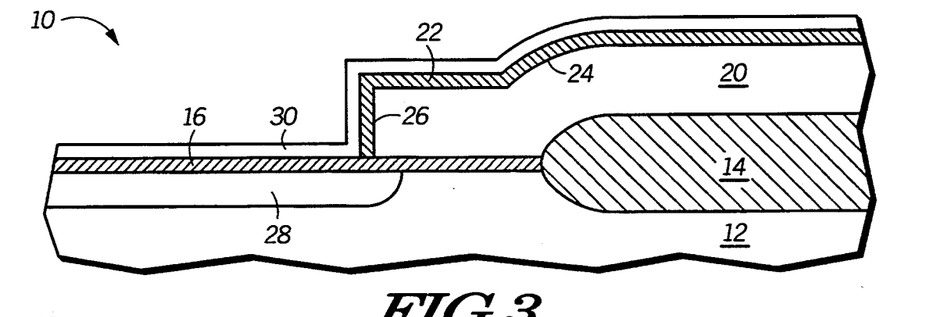

In FIG. 3, a sacrificial layer 30 of material is then formed overlying gate dielectric layer 16 and conductive member 20. Sacrificial layer 30 preferably has a thickness ranging from 5 to 200 nanometers, and may be deposited using conventional techniques such as sputter deposition, chemical vapor deposition, or spin-on deposition. In one embodiment sacrificial layer 30 is a layer of titanium nitride. Alternatively, sacrificial layer 30 may be another material such as silicon nitride, tantalum nitride, or the like.

Figure 4:
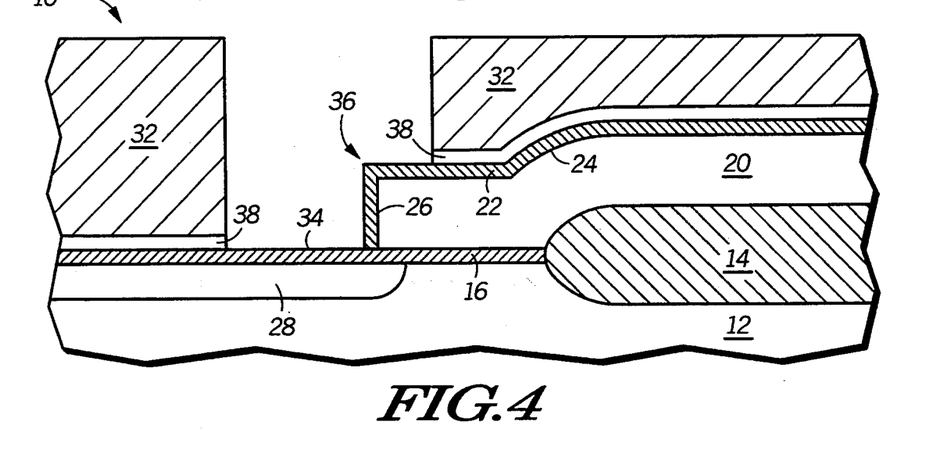

In FIG. 4, a photoresist mask 32 is then formed overlying sacrificial layer 30 using conventional photolithographic patterning techniques to define an exposed portion of sacrificial layer 30. The exposed portion of sacrificial layer 30 is then etched to form an exposed portion 34 of gate dielectric layer 16 and to form an exposed portion 36 of silicon dioxide layer 22. The etch process also leaves a remaining portion 38 of sacrificial layer 30 overlying the semiconductor substrate, as shown in FIG. 4. The exposed portion of sacrificial layer 30 is preferably removed using a dry etch. For example, if titanium nitride is used for sacrificial layer 30, then the exposed portion of sacrificial layer 30 may be removed using an etch chemistry that comprises chlorine. Alternatively, if silicon nitride is used for sacrificial layer 30, then the exposed portion of sacrificial layer 30 may be isotropically removed using an etch chemistry that comprises fluorine and chlorine.

Figure 5:
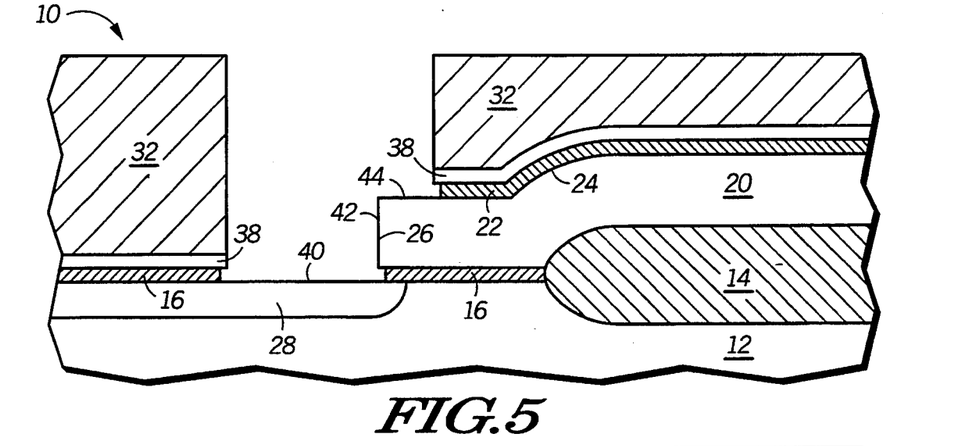

In FIG. 5, exposed portions 34 and 36 are etched to form an exposed portion 40 of doped region 28, an exposed sidewall portion 42 of conductive member 20, and an exposed surface portion 44 of conductive member 20. Exposed portions 34 and 36 are preferably removed using a buffered hydrofluoric acid solution. In addition, a portion of gate dielectric layer 16 that underlies conductive member 20 may also be etched during the etch process, as shown in FIG. 5. It should also be appreciated that the etch process used to remove the exposed portion of sacrificial layer 30 may leave a residual sidewall spacer adjacent to silicon dioxide layer 22, and that this sidewall spacer may be undercut and thus removed when exposed portion 42 is formed.

Figure 6:
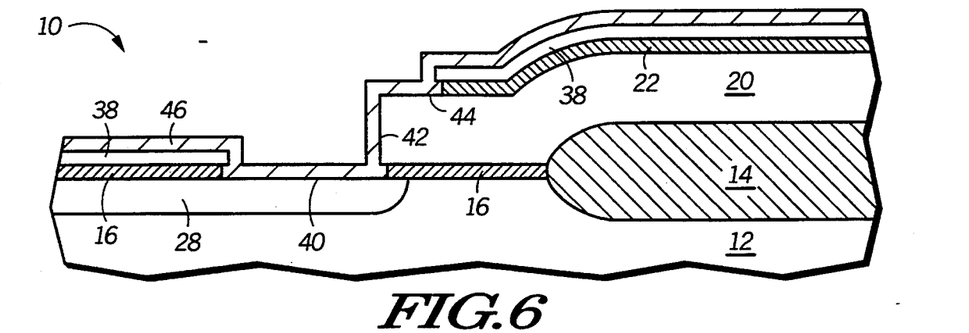

In FIG. 6, after photoresist mask 32 has been removed, a metal layer 46 is then formed overlying remaining portion 38, exposed portion 40, exposed surface portion 44, and abutting exposed sidewall portion 42. Metal layer 46 preferably has a thickness ranging from 10 to 200 nanometers, and may be deposited using conventional sputtering or chemical vapor deposition techniques. In one embodiment metal layer 46 is a layer of titanium. Alternatively, metal layer 46 may be another metal, such as cobalt, platinum, palladium, nickel, tantalum, tungsten, or the like. Photoresist mask 32 may be removed using an oxygen plasma ash, or with a stripping solution that comprises sulfuric acid, or using an oxygen plasma ash in conjunction with the stripping solution that comprises sulfuric acid.

Figure 7:
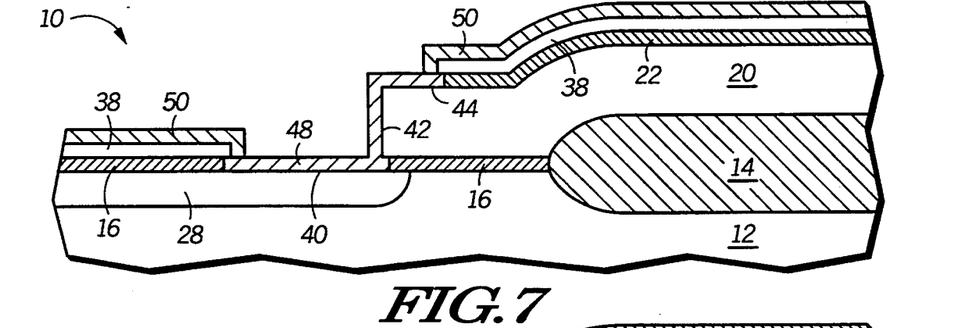

In FIG. 7, a portion of metal layer 46 is then reacted with exposed portion 40, exposed surface portion 44, and exposed sidewall portion 42 to form a metal silicide interconnect 48, and to leave an unsilicided portion 50 of metal layer 46. Metal silicide interconnect 48 abuts doped region 28, exposed surface portion 44, and exposed sidewall portion 42, such that doped region 28 and conductive member 20 are electrically coupled to each other. It should also be appreciated that if conductive layer 18 is a laminate, as previously discussed, then metal silicide interconnect 48 may also be formed such that it only abuts doped region 28 and exposed sidewall portion 42 of conductive member 20. Metal layer 46 is preferably annealed in a rapid thermal annealing system in order to react it with exposed portion 40, exposed surface portion 44, and exposed sidewall portion 42. Alternatively, metal silicide interconnect 48 may also be formed by annealing metal layer 46 in a diffusion furnace, or with a laser.

Figure 8:
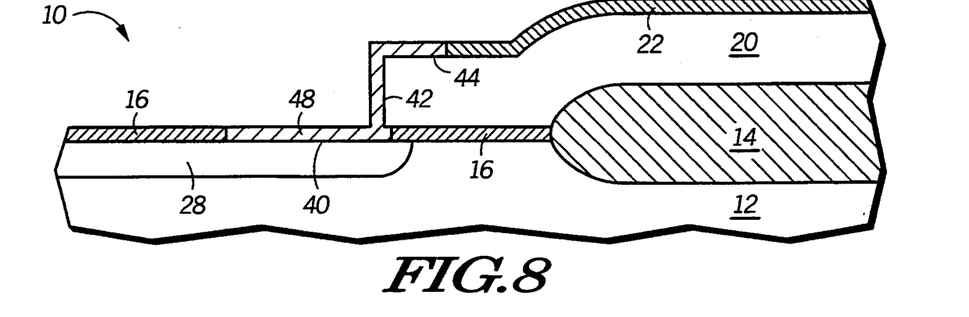

In FIG. 8, unsilicided portion 50 of metal layer 46 is then removed such that metal silicide interconnect 48 is substantially unaltered. In addition, remaining portion 38 of sacrificial layer 30 is also removed such that metal silicide interconnect 48 is substantially unaltered. It should be appreciated that unsilicided portion 50 and remaining portion 38 may be removed with the same etch process, or using two different etch processes. For example, if remaining portion 38 is titanium nitride and unsilicided portion 50 is either titanium or titanium nitride, then both portions may be removed in either an etch solution comprising ammonium hydroxide and hydrogen peroxide, or in an etch solution comprising sulfuric acid and hydrogen peroxide, or in an etch solution comprising phosphoric acid and hydrogen peroxide. Alternatively, if remaining portion 38 is silicon nitride and unsilicided portion 50 is cobalt then unsilicided portion 50 may be removed first using an etch solution comprising hydrochloric acid and hydrogen peroxide, and then remaining portion 38 may be isotropically removed using either a dry etch that comprises fluorine and chlorine or a wet etch solution that comprises phosphoric acid. It is important to note that if conductive member 20 were electrically coupled to doped region 28, using a standard buried contact process, then a portion of doped region 28 would be undesirably trenched when conductive member 20 was formed. In the present invention, however, metal silicide interconnect 48 allows conductive member 20 to be electrically coupled to doped region 28 without the formation of such a trench, as shown in FIG. 8.

Figure 9:
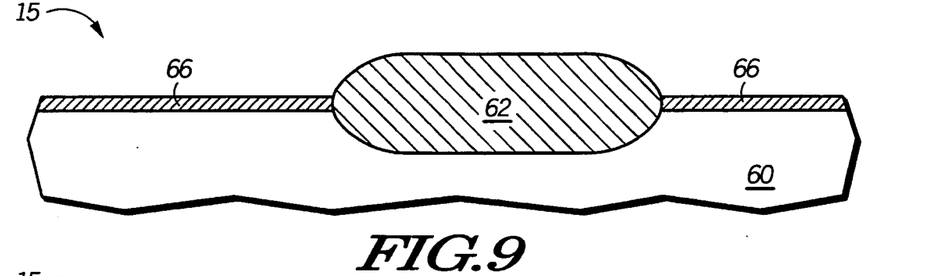
FIGS. 9–15 illustrate, in cross-section, process steps in accordance with an alternative embodiment of the invention.

FIGS. 9 through 16 illustrate, in cross-section, process steps in accordance with an alternative embodiment of the invention, wherein a metal silicide interconnect is formed in an integrated circuit. Shown in FIG. 9 is a portion 15 of an integrated circuit structure comprising a semiconductor substrate 60 having a first conductivity type, a field isolation region 62, and a gate dielectric layer 66. Semiconductor substrate 60 as defined herein may be a portion of a doped semiconductor substrate or a well region formed within a semiconductor substrate. For example, semiconductor substrate 60 may be a portion of either an n-type or p-type monocrystalline silicon substrate, or an n-type or p-type well region formed within either an n-type or p-type monocrystalline silicon substrate. Semiconductor substrate 60 may also be a portion of a doped silicon on insulator substrate or a portion of a doped silicon on sapphire substrate, or the like. For example, semiconductor substrate 60 may be a portion of either an n-type or p-type silicon on insulator substrate or a portion of either an n-type or p-type silicon on sapphire substrate, or an n-type or p-type well region formed within either a silicon on insulator substrate or a silicon on sapphire substrate, or the like. Field isolation region 62 is preferably a layer of thermal silicon dioxide, which is formed using well know isolation techniques such as local oxidation of silicon (LOCOS), polysilicon buffered LOCOS (PBL), or the like, and has a thickness ranging from 100 to 1000 nanometers. In addition, although it is not shown in FIG. 9 a doped region may also be formed to underlie field isolation region 62 using well-known techniques. For example, a doped region may be formed by implanting a portion of semiconductor substrate 60 and then thermally oxidizing that portion of semiconductor substrate 60 to form field isolation region 62. Gate dielectric layer 66 is then formed abutting field isolation region 62, and preferably has a thickness ranging from 3 to 20 nanometers. In one embodiment gate dielectric layer 66 is formed by thermally oxidizing a surface portion of semiconductor substrate 60. Alternatively, gate dielectric layer 66 may be a layer of chemically vapor deposited silicon dioxide, or another dielectric material such as silicon oxynitride, which may be formed by thermally nitriding a layer of thermal or deposited silicon dioxide in an ambient containing ammonia ($NH_3$), nitrous oxide ($N_2O$), or nitric oxide (NO). Moreover, gate dielectric layer 66 may be a laminate comprising a layer of chemically vapor deposited silicon dioxide overlying either a layer of thermal silicon dioxide or a layer of silicon oxynitride.

Figure 10:
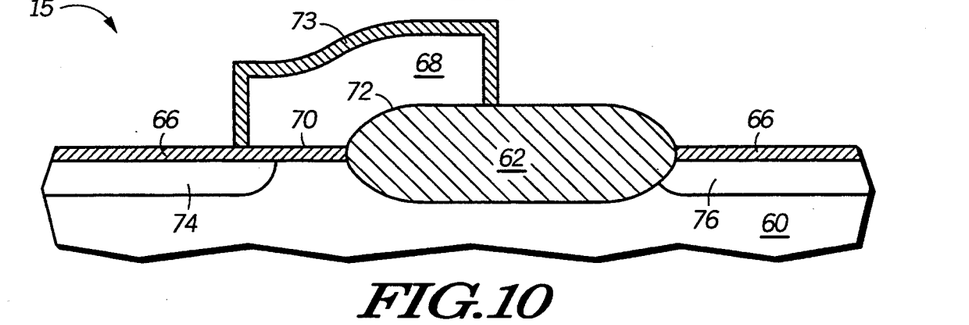

In FIG. 10, a conductive layer is then formed overlying gate dielectric layer 66 and field isolation region 62. The conductive layer may be a doped polysilicon layer formed using conventional deposition and doping techniques. Alternatively, the conductive layer may be a laminate comprising a doped polysilicon layer underlying either a metal silicide layer, a metal layer, or a metal nitride layer. After its formation, the conductive layer is then patterned using conventional photolithographic patterning and etching techniques to form a conductive member 68. Conductive member 68 is formed such that it overlies a portion 70 of gate dielectric layer 66 and a portion 72 of field isolation region 62, as shown in FIG. 10. After being patterned, a portion of conductive member 68 is then thermally oxidized to form a silicon dioxide layer 73 that abuts the top surface and the sidewall of conductive member 68. It should also be appreciated that if the conductive layer is a laminate, as previously discussed, then silicon dioxide layer 73 may be formed such that it does not overlie the top surface of conductive member 68, and it only abuts a portion of the sidewall. Semiconductor substrate 60 is then implanted with ions having a second conductivity type to form a first electrode region 74 and a second electrode region 76 within semiconductor substrate 60. First electrode region 74 is formed such that it is offset from field isolation region 62 and it underlies a portion of conductive member 68. Second electrode region 76 abuts a portion of field isolation region 62, and it is formed such that field isolation region 62 lies in between it and first electrode region 74.

Figure 11:
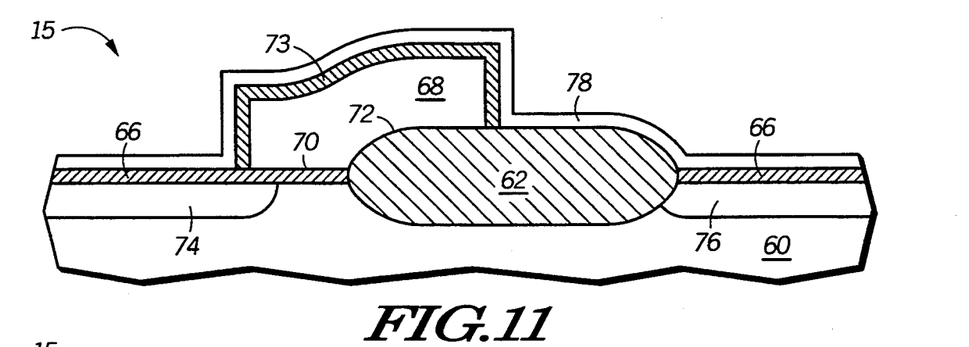

In FIG. 11, a sacrificial layer 78 of material is then formed overlying gate dielectric layer 66, conductive member 68, and field isolation region 62. Sacrificial layer 78 preferably has a thickness ranging from 5 to 200 nanometers, and may be deposited using conventional techniques such as sputter deposition, chemical vapor deposition, or spin-on deposition. In one embodiment sacrificial layer 78 is a layer of titanium nitride. Alternatively, sacrificial layer 78 may be another material such as silicon nitride, tantalum nitride, or the like. For example, if silicon nitride sidewall spacers are used to form the source and drain regions of transistors in the integrated circuit, then it may be preferable for sacrificial layer 78 to be a layer of silicon nitride.

Figure 12:
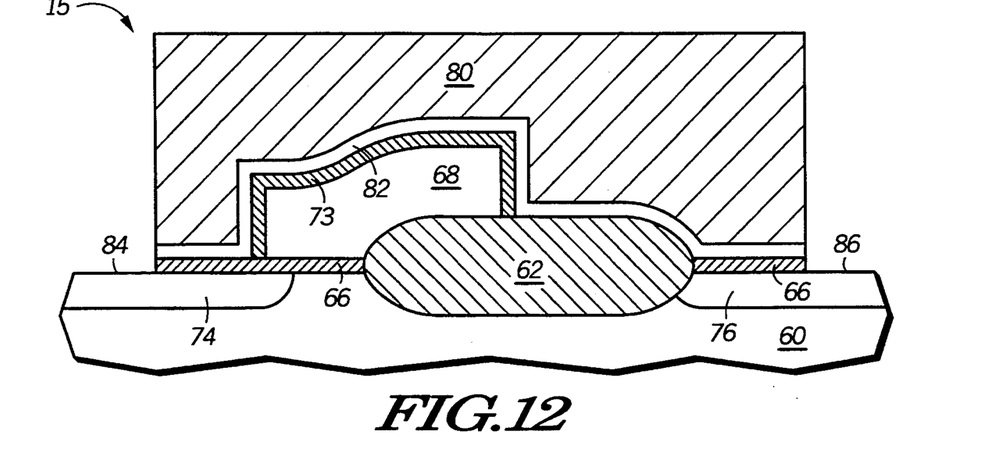

In FIG. 12, a photoresist mask 80 is then formed overlying sacrificial layer 78 using conventional photolithographic patterning techniques to define an exposed portion of sacrificial layer 78. The exposed portion of sacrificial layer 78 is then etched to form an exposed portion of gate dielectric layer 66 and to form a remaining portion 82 of sacrificial layer 78. Remaining portion 82 overlies conductive member 68 and field isolation region 62, as shown in FIG. 12. The exposed portion of gate dielectric layer 66 is then etched to form an exposed portion 84 of first electrode region 74 and an exposed portion 86 of second electrode region 76. Sacrificial layer 78 and gate dielectric layer 66 are preferably patterned with a dry etch process. In addition, it should also be appreciated that sacrificial layer 78 and dielectric layer 66 may etched with either the same etch chemistry or with two different etch chemistries.

Figure 13:
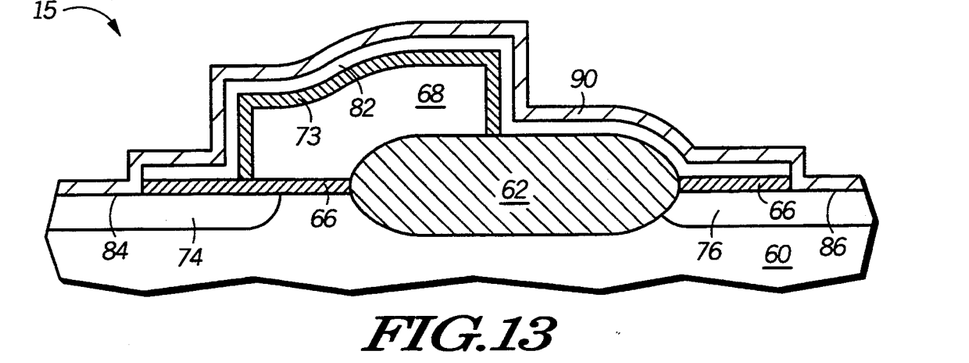

In FIG. 13, after photoresist mask 80 has been removed a metal layer 90 is then formed overlying remaining portion 82, exposed portion 84, and exposed portion 86. Metal layer 90 preferably has a thickness ranging from 10 to 200 nanometers, and may be deposited using conventional sputtering or chemical vapor deposition techniques. In one embodiment metal layer 90 is a layer of titanium. Alternatively, metal layer 90 may be another metal, such as cobalt, platinum, palladium, nickel, tantalum, tungsten, or the like. Photoresist mask 80 may be removed using an oxygen plasma ash, or with a stripping solution that comprises sulfuric acid, or using an oxygen plasma ash in conjunction with the stripping solution that comprises sulfuric acid.

Figure 14:
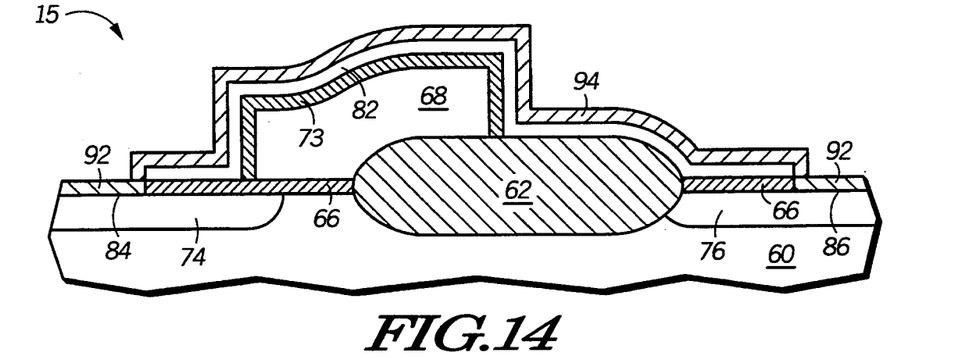

In FIG. 14, a portion of metal layer 90 is then reacted with exposed portion 84, and exposed surface portion 86 to form a metal silicide interconnect 92, and to leave an unsilicided portion 94 of metal layer 90 overlying remaining portion 82. Metal silicide interconnect 92 overlies a portion of first electrode region 74 and a portion of second electrode region 76. In addition, metal silicide interconnect 92 is offset from field isolation region 62 by a portion of gate dielectric layer 66, as shown in FIG. 14. Metal layer 90 is preferably annealed in a rapid thermal annealing system in order to react it with exposed portion 84 and exposed surface portion 86. Alternatively, metal silicide interconnect 92 may also be formed by annealing metal layer 90 in a diffusion furnace, or with a laser.

Figure 15:
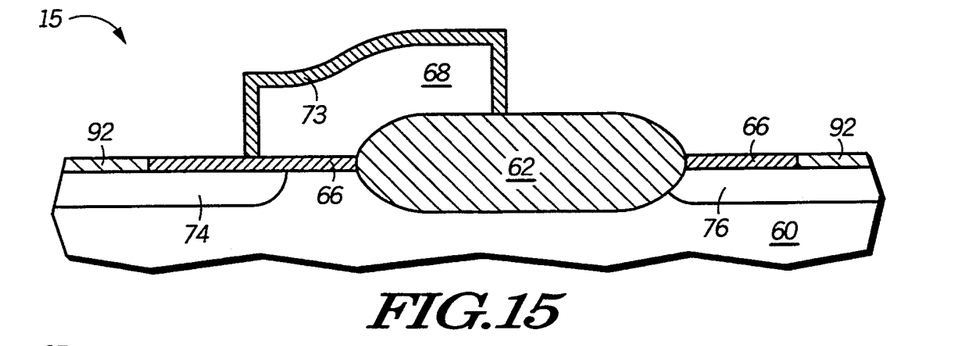

In FIG. 15, unsilicided portion 94 of metal layer 90 is then removed such that metal silicide interconnect 92 is substantially unaltered. In addition, remaining portion 82 of sacrificial layer 78 is also removed such that metal silicide interconnect 92 is substantially unaltered. It should be appreciated that unsilicided portion 94 and remaining portion 82 may be removed with the same etch process, or using two different etch processes. For example, if remaining portion 82 is titanium nitride and unsilicided portion 94 is either titanium or titanium nitride, then both portions may be removed in either an etch solution comprising ammonium hydroxide and hydrogen peroxide, or in an etch solution comprising sulfuric acid and hydrogen peroxide, or in an etch solution comprising phosphoric acid and hydrogen peroxide. Alternatively, if remaining portion 82 is silicon nitride and unsilicided portion 94 is cobalt then unsilicided portion 94 may be removed first using an etch solution comprising hydrochloric acid and hydrogen peroxide, and then remaining portion 82 may be isotropically removed using either a dry etch that comprises fluorine and chlorine or a wet etch solution that comprises phosphoric acid. It should be appreciated that the resulting structure shown in FIG. 15 may be used to form a protection device in an integrated circuit. For example, in subsequent processing steps conductive member 68 may be electrically coupled to first electrode region 74, and first electrode region 74 may be electrically coupled to ground or the voltage supply of the integrated circuit through metal silicide interconnect 92, and second electrode region 76 may be electrically coupled to an input/output pad of the integrated circuit through metal silicide interconnect 92.

Figure 16:
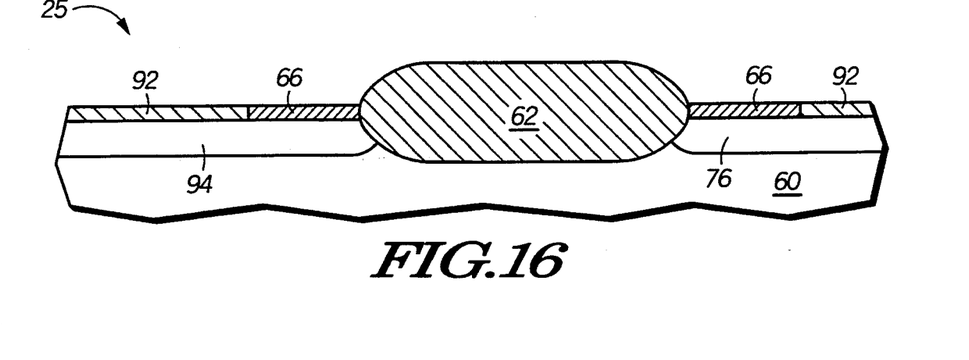
FIG. 16 illustrates, in cross-section, an integrated circuit structure in accordance with an alternative embodiment of the invention.

In addition, it should also be appreciated that the formation of conductive member 68 is optional, and that its omission will result in integrated circuit structure 25, which is shown in FIG. 16. Similarly, integrated circuit structure 25 may also be used as a protection device in an integrated circuit. For example, first electrode region 94 may be electrically coupled to ground or the voltage supply of the integrated circuit through metal silicide interconnect 92 and second electrode region 76 may be electrically coupled to an input/output pad of the integrated circuit through metal silicide interconnect 92.

Figure 17:
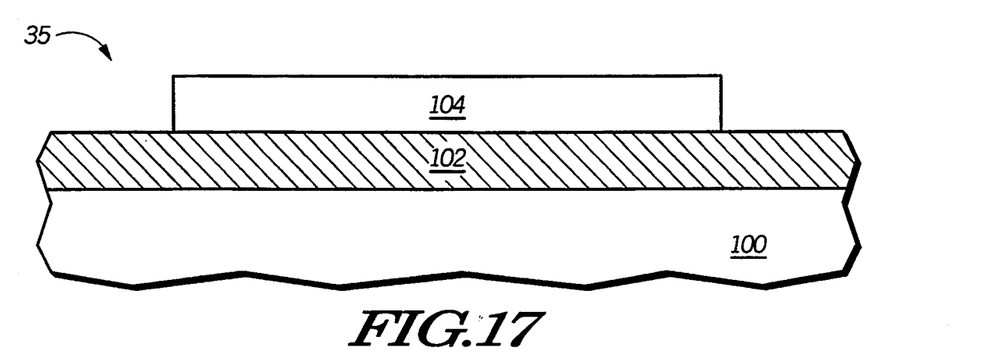
FIGS. 17–22 illustrate, in cross-section, process steps in accordance with an alternative embodiment of the invention.

FIGS. 17 through 22 illustrate, in cross-section, process steps in accordance with an alternative embodiment of the invention, wherein a metal silicide interconnect is formed in an integrated circuit. Shown in FIG. 17 is a portion 35 of an integrated circuit structure comprising a semiconductor substrate 100, a dielectric layer 102, and a patterned silicon layer 104. Semiconductor substrate 100 is preferably a monocrystalline silicon substrate. Alternatively, semiconductor substrate 100 may also be a silicon on insulator substrate, a silicon on sapphire substrate, or the like. Dielectric layer 102 may be a layer of thermally grown silicon dioxide. Alternatively, dielectric layer 102 may be a layer of chemically vapor deposited or plasma deposited silicon dioxide, chemically vapor deposited or plasma deposited silicon nitride, or the like. In one embodiment patterned silicon layer 104 is a patterned layer of polysilicon. Alternatively, patterned silicon layer 104 may be another type of silicon material such as amorphous silicon, recrystallized silicon, or the like.

Figure 18:
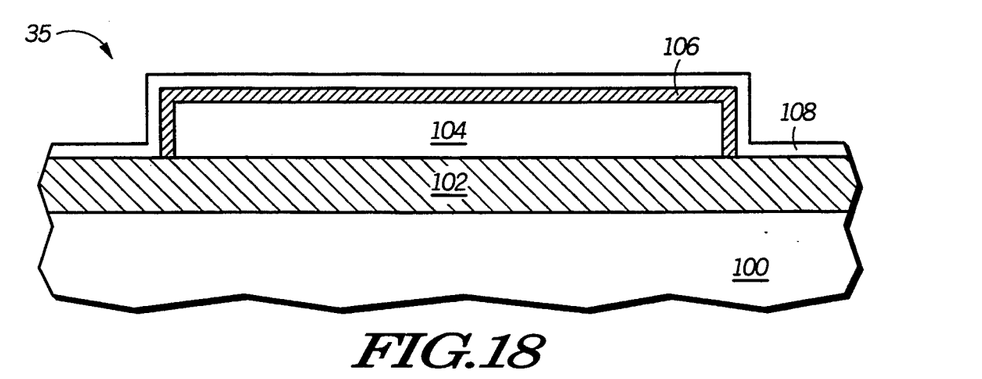

In FIG. 18, a dielectric layer 106 is then formed overlying pattern silicon layer 104. Dielectric layer 106 is preferably a silicon dioxide layer formed by thermally oxidizing a portion of patterned silicon layer 104. Alternatively, dielectric layer 106 may be a layer of chemically vapor deposited or plasma deposited silicon dioxide, or another dielectric material such as silicon nitride. A sacrificial layer 108 of material is then formed overlying dielectric layer 106 and dielectric layer 104. Sacrificial layer 108 preferably has a thickness ranging from 5 to 200 nanometers, and may be deposited using conventional techniques such as sputter deposition, chemical vapor deposition, or spin-on deposition. In one embodiment sacrificial layer 108 is a layer of titanium nitride. Alternatively, sacrificial layer 108 may be another material such as silicon nitride, tantalum nitride, or the like.

Figure 19:
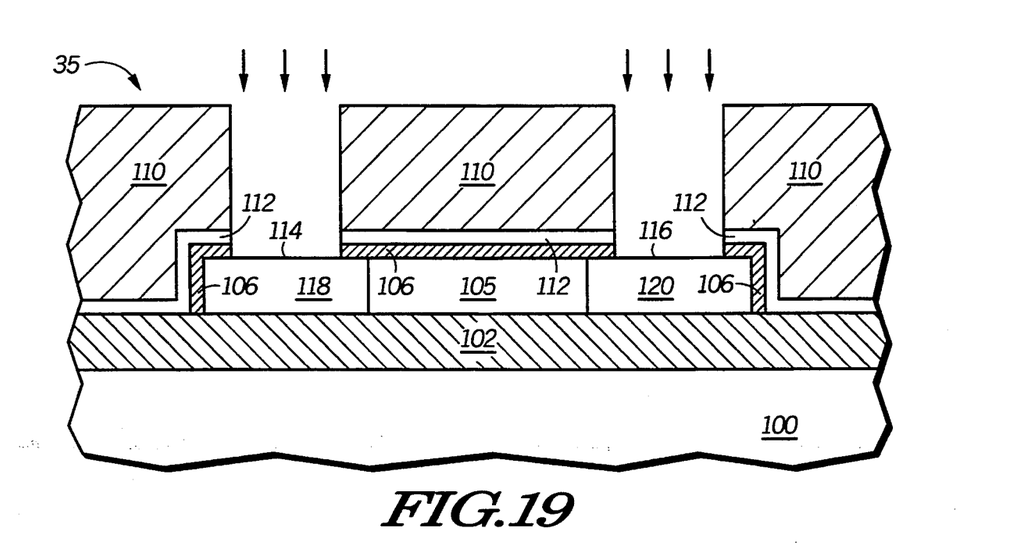

In FIG. 19, a photoresist mask 110 is then formed overlying sacrificial layer 108 using conventional photolithographic patterning techniques to define an exposed portion of sacrificial layer 108. The exposed portion of sacrificial layer 108 is then etched to form an exposed portion of dielectric layer 106 and to form a remaining portion 112 of sacrificial layer 108. The exposed portion of dielectric layer 106 is then etched to form a first exposed portion 114 of patterned silicon layer 104 and a second exposed portion 116 of patterned silicon layer 104. Sacrificial layer 108 and dielectric layer 106 are preferably patterned with a dry etch process. In addition, it should also be appreciated that sacrificial layer 108 and dielectric layer 106 may etched with either the same etch chemistry or with two different etch chemistries. First exposed portion 114 and second exposed portion 116 are then implanted with ions having either an n-type conductivity or p-type conductivity to form a first electrode region 118 and a second electrode region 120 within patterned silicon layer 104, and to leave a remaining portion 105 of patterned silicon layer 104.

Figure 20:
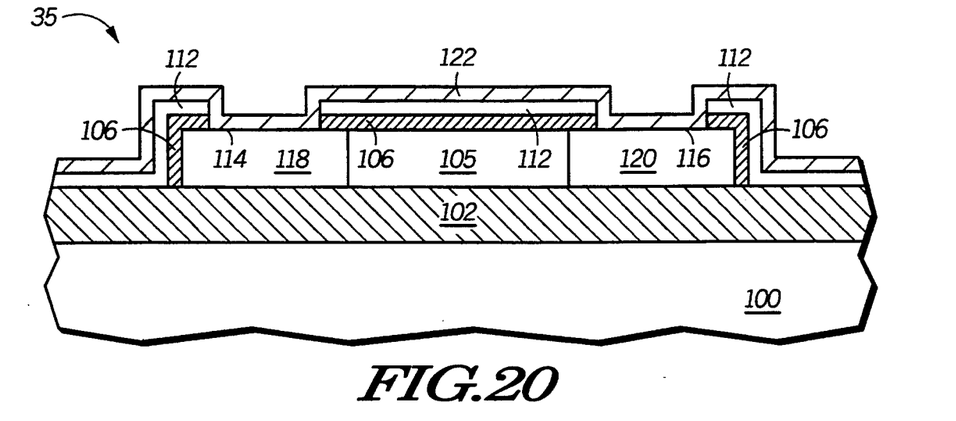

In FIG. 20, after photoresist mask 110 has been removed a metal layer 122 is then formed overlying remaining portion 112, first exposed portion 114, and second exposed portion 116. Metal layer 122 preferably has a thickness ranging from 10 to 200 nanometers, and may be deposited using conventional sputtering or chemical vapor deposition techniques. In one embodiment metal layer 122 is a layer of titanium. Alternatively, metal layer 122 may be another metal, such as cobalt, platinum, palladium, nickel, tantalum, tungsten, or the like. Photoresist mask 110 may be removed using an oxygen plasma ash, or with a stripping solution that comprises sulfuric acid, or using an oxygen plasma ash in conjunction with the stripping solution that comprises sulfuric acid.

Figure 21:
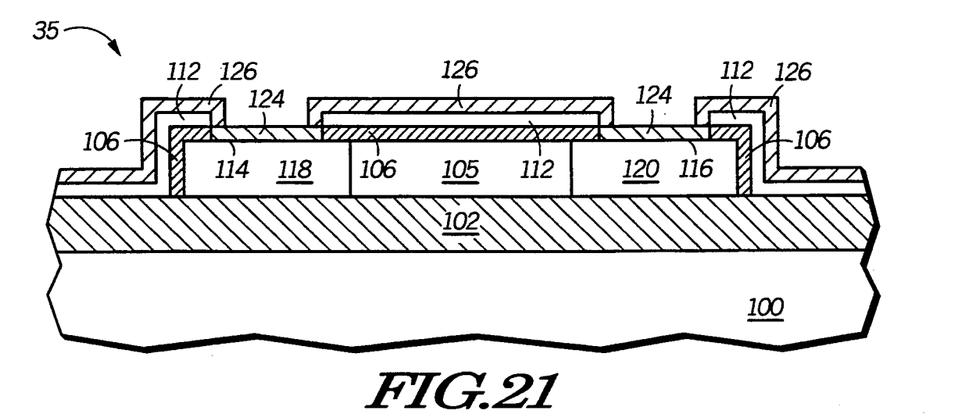

In FIG. 21, a portion of metal layer 122 is then reacted with first exposed portion 114 and second exposed portion 116 to form a metal silicide interconnect 124, and to leave an unsilicided portion 126 of metal layer 122 overlying remaining portion 112. Metal silicide interconnect 124 overlies first electrode region 118 and second electrode region 118, as shown in FIG. 21. Metal layer 122 is preferably annealed in a rapid thermal annealing system in order to react it with first exposed portion 114 and second exposed portion 116. Alternatively, metal silicide interconnect 124 may also be formed by annealing metal layer 122 in a diffusion furnace, or with a laser.

Figure 22:
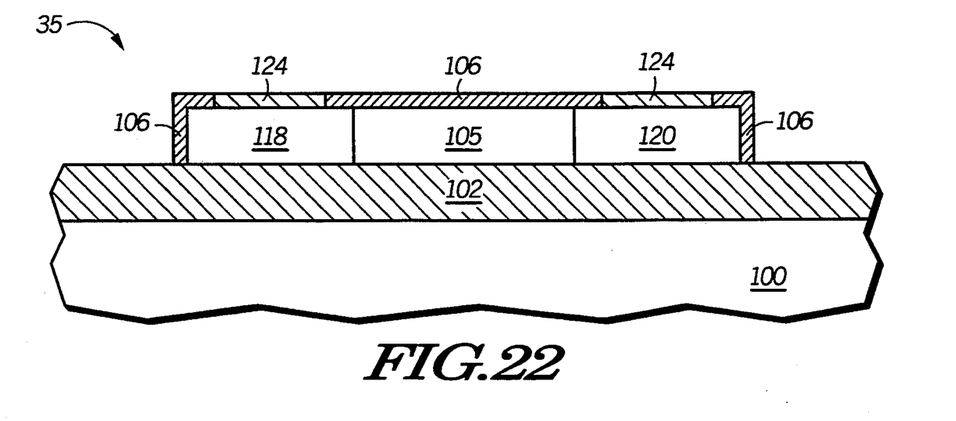

In FIG. 22, unsilicided portion 126 of metal layer 122 is then removed such that metal silicide interconnect 124 is substantially unaltered. In addition, remaining portion 112 of sacrificial layer 108 is also removed such that metal silicide interconnect 124 is substantially unaltered. It should be appreciated that unsilicided portion 126 and remaining portion 112 may be removed with the same etch process, or using two different etch processes. For example, if remaining portion 112 is titanium nitride and unsilicided portion 126 is either titanium or titanium nitride, then both portions may be removed in either an etch solution comprising ammonium hydroxide and hydrogen peroxide, or in an etch solution comprising sulfuric acid and hydrogen peroxide, or in an etch solution comprising phosphoric acid and hydrogen peroxide. Alternatively, if remaining portion 112 is silicon nitride and unsilicided portion 126 is cobalt then unsilicided portion 126 may be removed first using an etch solution comprising hydrochloric acid and hydrogen peroxide, and then remaining portion 112 may be isotropically removed using either a dry etch that comprises fluorine and chlorine or a wet etch solution that comprises phosphoric acid. It should be appreciated that the resulting structure shown in FIG. 22 may be used to form a resistor in an integrated circuit. More specifically, remaining portion 105 may be used as a resistor and first electrode region 118 may be used as a first resistor terminal and second electrode region 120 may be used as a second resistor terminal. For example, in subsequent processing steps first electrode region 118 may be electrically coupled to the storage node of a static memory cell through metal silicide interconnect 124, and second electrode region 120 may be electrically coupled to a supply voltage through metal silicide interconnect 124 to form a load resistor for the memory cell. Alternatively, in subsequent processing steps first electrode region 118 may be electrically coupled to the collector contact of a bipolar transistor through metal silicide interconnect 124, and second electrode region may be electrically coupled to a supply voltage through metal silicide interconnect 124 to form a load resistor for the bipolar transistor.

The foregoing description and illustrations contained herein demonstrate many of the advantages associated with the present invention. In particular, a method for forming a low resistance metal silicide interconnect in an integrated circuit has been disclosed. Moreover, formation of the metal silicide interconnect is compatible with the fabrication of protection devices in an integrated circuit. Furthermore, formation of the metal silicide interconnect is also compatible with the fabrication of resistors in an integrated circuit. In addition, the metal silicide interconnect also allows the source or drain electrode of a first transistor to be electrically coupled to the gate electrode of a second transistor without trenching the underlying semiconductor substrate. Moreover, the area required to electrically couple the gate electrode to the source or drain region may be reduced because the contact portion of the gate electrode need not be oversized to limit trenching, and therefore smaller static memory cell sizes can be obtained. Yet another advantage is that the present invention also allows a doped polysilicon member to be electrically coupled to a doped region formed within a semiconductor substrate, wherein the doped polysilicon member and the doped region have different conductivity types.

Thus it is apparent that there has been provided, in accordance with the invention, a method for forming a metal silicide interconnect in an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, it is envisioned that materials other than titanium nitride, silicon nitride, and tantalum nitride may also be used as sacrificial layers. In addition, the invention is not limited to a particular metal layer. It is also important to note that the present invention is not limited in any way to the specific etch chemistries described herein. Furthermore, the invention is not limited to forming the metal silicide interconnect by rapid thermal annealing. Therefore, it is intended that this invention encompass all such variations and modifications as fall within the scope of the appended claims.

What is claimed is:

1. A method for forming a metal silicide interconnect in an integrated circuit comprising the steps of:

providing a semiconductor substrate;

forming a field isolation region within a first portion of the semiconductor substrate;

forming a gate dielectric layer overlying the semiconductor substrate, wherein the gate dielectric layer abuts the field isolation region;

forming a conductive member overlying a portion of the gate dielectric layer and a portion of the field isolation region;

forming a first electrode region having a first conductivity type within a second portion of the semiconductor substrate and a second electrode region having the first conductivity type within a third portion of the semiconductor substrate, wherein the field isolation region lies in between the first electrode region and the second electrode region and the conductive member overlies only the first electrode region;

forming a sacrificial layer of material overlying the gate dielectric layer, the conductive member and the field isolation region;

forming a photoresist mask overlying the sacrificial layer of material, wherein the photoresist mask defines an exposed portion of the sacrificial layer of material;

etching the exposed portion of the sacrificial layer of material to leave a remaining portion of the sacrificial layer of material overlying the field isolation region, and to form an exposed portion of the gate dielectric layer;

etching the exposed portion of the gate dielectric layer to form an exposed portion of the first electrode region and an exposed portion of the second electrode region;

removing the photoresist mask;

depositing a metal layer overlying the exposed portion of the first electrode region, the exposed portion of the second electrode region, and the remaining portion of the sacrificial layer of material after the photoresist mask has been removed;

reacting the metal layer with the exposed portion of the first electrode region and the exposed portion of the second electrode region to form a metal silicide interconnect overlying the exposed portion of the first electrode region and the exposed portion of the second electrode region and to leave an unsilicided portion of the metal layer overlying the conductive member and the field isolation region;

removing the unsilicided portion of the metal layer to expose the remaining portion of the sacrificial layer of material; and removing the remaining portion of the sacrificial layer of material to expose at least a portion of the field isolation region.

2. The method of claim 1, wherein the step of forming the sacrificial layer of material is further characterized as depositing a layer of silicon nitride.

3. The method of claim 2, wherein the step of removing the remaining portion of the sacrificial layer is further characterized as etching the remaining portion of the sacrificial layer with an isotropic dry etch.

4. The method of claim 2, wherein the step of removing the remaining portion of the sacrificial layer is further characterized as etching the remaining portion of the sacrificial layer with a phosphoric acid solution.

5. The method of claim 1, wherein the step of forming the sacrificial layer of material is further characterized as depositing a layer of titanium nitride.

6. The method of claim 5, wherein the step of removing the remaining portion of the sacrificial layer is further characterized as etching the remaining portion of the sacrificial layer with at least one etchant selected from the group consisting of hydrogen peroxide, ammonium hydroxide, phosphoric acid, and sulfuric acid.

7. The method of claim 1, wherein the step of depositing the metal layer is further characterized as depositing a layer of cobalt.

8. The method of claim 1, wherein the step of depositing the metal layer is further characterized as depositing a layer of titanium.

9. The method of claim 1, wherein the step of reacting the metal layer is further characterized as rapid thermally annealing the metal layer to form the metal silicide interconnect.

10. The method of claim 1, wherein the step of forming the conductive member comprises the step of:
depositing a layer of polysilicon.

11. A method for forming a metal silicide interconnect in an integrated circuit comprising the steps of:
providing a semiconductor substrate;
forming a field isolation region within a first portion of the semiconductor substrate;
forming a gate dielectric layer overlying the semiconductor substrate, wherein the gate dielectric layer abuts the field isolation region;
forming a first electrode region having a first conductivity type within a second portion of the semiconductor substrate and a second electrode region having the first conductivity type within a third portion of the semiconductor substrate, wherein the field isolation region lies in between the first electrode region and the second electrode region;
forming a sacrificial layer of material overlying the gate dielectric layer and the field isolation region;
forming a photoresist mask overlying the sacrificial layer of material, wherein the photoresist mask defines an exposed portion of the sacrificial layer of material;
etching the exposed portion of the sacrificial layer of material to leave a remaining portion of the sacrificial layer of material overlying the field isolation region and to form an exposed portion of the first electrode region and an exposed portion of the second electrode region, wherein the exposed portion of the first electrode region and the exposed portion of the second electrode region are offset from the field isolation region;
removing the photoresist mask;
depositing a metal layer overlying the exposed portion of the first electrode region, the exposed portion of the second electrode region, and the remaining portion of the sacrificial layer of material after the photoresist mask has been removed;
reacting the metal layer with the exposed portion of the first electrode region and the exposed portion of the second electrode region to form a metal silicide interconnect overlying the exposed portion of the first electrode region and the exposed portion of the second electrode region and to leave an unsilicided portion of the metal layer overlying the field isolation region;
removing the unsilicided portion of the metal layer to expose the remaining portion of the sacrificial layer; and
removing the remaining portion of the sacrificial layer of material to expose the field isolation region.

12. The method of claim 11, wherein the step of forming the sacrificial layer of material is further characterized as depositing a layer of silicon nitride.

13. The method of claim 11, wherein the step of removing the remaining portion of the sacrificial layer is further characterized as etching the remaining portion of the sacrificial layer with an isotropic dry etch.

14. The method of claim 11, wherein the step of removing the remaining portion of the sacrificial layer is further characterized as etching the remaining portion of the sacrificial layer with a phosphoric acid solution.

15. The method of claim 11, wherein the step of forming the sacrificial layer of material is further characterized as depositing a layer of titanium nitride.

16. The method of claim 11, wherein the step of depositing the metal layer is further characterized as depositing a layer of cobalt.

17. The method of claim 11, wherein the step of depositing the metal layer is further characterized as depositing a layer of titanium.

18. The method of claim 11, wherein the step of reacting the metal layer is further characterized as rapid thermally annealing the metal layer to form the metal silicide interconnect.

19. The method of claim 11, wherein the step of removing the remaining portion of the sacrificial layer is further characterized as etching the remaining portion of the sacrificial layer with at least one etchant selected from the group consisting of hydrogen peroxide, ammonium hydroxide, phosphoric acid, and sulfuric acid.

* * * * *